United States Patent
Lipnicki et al.

(10) Patent No.: US 11,515,764 B2
(45) Date of Patent: Nov. 29, 2022

(54) METHOD AND A DEVICE FOR DETERMINATION OF A TORSIONAL DEFLECTION OF A ROTATION SHAFT AND OF A DC-LINK DEGRADATION IN THE ELECTROMECHANICAL DRIVETRAIN

(71) Applicant: ABB Schweiz AG, Baden (CH)

(72) Inventors: Piotr Lipnicki, Lublin (PL); Daniel Lewandowski, Cracow (PL)

(73) Assignee: ABB Schweiz AG, Baden (CH)

( * ) Notice: Subject to any disclaimer, the term of this patent is extended or adjusted under 35 U.S.C. 154(b) by 1027 days.

(21) Appl. No.: 16/212,762

(22) Filed: Dec. 7, 2018

(65) Prior Publication Data
US 2019/0109519 A1 Apr. 11, 2019

Related U.S. Application Data

(63) Continuation of application No. PCT/EP2017/000567, filed on May 9, 2017.

(30) Foreign Application Priority Data

Jun. 7, 2016 (EP) ..................... 16460036

(51) Int. Cl.
*H02K 11/35* (2016.01)
*H02P 23/04* (2006.01)
(Continued)

(52) U.S. Cl.
CPC ............... *H02K 11/35* (2016.01); *G01L 3/00* (2013.01); *G01R 31/343* (2013.01); *H02P 6/10* (2013.01); *H02P 23/04* (2013.01); *H02P 23/14* (2013.01)

(58) Field of Classification Search
CPC ... H02K 11/35; G01L 3/00; H02P 6/10; H02P 23/04; H02P 23/14; G01R 31/343
See application file for complete search history.

(56) References Cited

U.S. PATENT DOCUMENTS

| 4,137,780 A | * | 2/1979 | Wolfinger | ................ G01H 1/10 |
| | | | | 73/650 |
| 2006/0033466 A1 | * | 2/2006 | Yamada | ................... H02P 7/42 |
| | | | | 318/800 |

(Continued)

FOREIGN PATENT DOCUMENTS

| EP | 1626491 A2 | 2/2006 |
| EP | 2523009 A1 | 11/2012 |

(Continued)

OTHER PUBLICATIONS

European Patent Office, International Search Report & Written Opinion issued in corresponding Application No. PCT/EP2017/000567, dated Aug. 8, 2017, 9 pp.

(Continued)

*Primary Examiner* — Tarun Sinha
*Assistant Examiner* — Lal C Mang
(74) *Attorney, Agent, or Firm* — Leydig, Voit & Mayer, Ltd.

(57) ABSTRACT

The subject of the invention is a method and a device for determination of a torsional deflection of a rotation shaft in the electromechanical drivetrain. The method uses a current and a voltage signals measurement of the driving electrical machine and an angular speed measurement of the shaft of the drivetrain and includes the step of measuring of a voltage $U_{DC}$ of the DC link unit of a converter; the step of calculating a value of a load torque $T_{load}$ of the driving electrical machine; the step of detecting of an oscillation $O_{SC}(T_{load})$ in the load torque $T_{load}$ and calculation magnitudes of characteristic frequencies of Fast Fourier Transform $FFT(U_{DC})$ of the voltage $U_{DC}$ of DC link unit; the step of determining of a timestamp indicators $t_{Tload}$ for oscillations $O_{SC}(T_{load})$ and $t_{FFT}$ of $U_{DC}$ for magnitudes of characteristic frequencies of $FFT(U_{DC})$ of the voltage $U_{DC}$ of DC link unit; the step of comparing the value of the timestamp indicators $t_{Tload}$ and (Continued)

$t_{FFT}$ and determining a torsional deflection of the rotation shaft if $t_{Tload} < t_{FFT}$; the step of presenting the result of the comparison to the user in a diagnostic unit.

20 Claims, 4 Drawing Sheets

(51) Int. Cl.
    *H02P 6/10*      (2006.01)
    *H02P 23/14*      (2006.01)
    *G01L 3/00*      (2006.01)
    *G01R 31/34*      (2020.01)

(56) References Cited

U.S. PATENT DOCUMENTS

| | | | | |
|---|---|---|---|---|
| 2008/0303477 | A1* | 12/2008 | Patel | H02P 27/04 318/802 |
| 2011/0022261 | A1 | 1/2011 | Pushkolli et al. | |
| 2012/0217824 | A1* | 8/2012 | Gupta | H02J 3/28 307/145 |
| 2012/0239348 | A1* | 9/2012 | Banerjee | G06F 19/00 702/183 |
| 2014/0074427 | A1* | 3/2014 | Ottewill | G01B 7/003 702/151 |
| 2017/0038418 | A1* | 2/2017 | Lipnicki | G01R 27/2605 |

FOREIGN PATENT DOCUMENTS

| | | |
|---|---|---|
| EP | 2743670 A1 | 6/2014 |
| WO | 2011019321 A2 | 2/2011 |

OTHER PUBLICATIONS

European Patent Office, Extended Search Report issued in corresponding Application No. 16460036.3, dated Jan. 12, 2017, 6 pp.

* cited by examiner

METHOD AND A DEVICE FOR DETERMINATION OF A TORSIONAL DEFLECTION OF A ROTATION SHAFT AND OF A DC-LINK DEGRADATION IN THE ELECTROMECHANICAL DRIVETRAIN

The subject of the invention is a method and a device for determination of a torsional deflection of a rotation shaft in the electromechanical drivetrain, which is useful in condition monitoring practices for systems including electrical motors/generators connected with the loads by a rotational shaft and mechanical couplings.

BACKGROUND OF THE INVENTION

Mechanical drivetrains are one of the most important elements of today's industry. Many of them are equipped with power electronics and being considered as critical for plant production process. Mechanical shaft is one of the elements of the drive train in which may break and failures can happen. Unfortunately this means that the whole industrial installation must be shut down in emergency mode to be repaired. So there is a need for greater efficiency and reliability of the mechanical drivetrains comprising the variable frequency converters. When looking into whole drivetrain there are many different kinds of possible faults, which can appear. One of them is the problem of shaft torsional deflection. If the shaft loading is exceeding the maximum nominal values or the improper control of the drive train is putting more stress on the shaft there is a high possibility that the shaft may break. If the shaft is solid material made, then it will fail by a crack initiating at the surface and propagating through to the core of the shaft. Assuring proper monitoring of the shaft torsional deflection level is one of the solutions for drivetrain status determination. The shaft deterioration usually manifests by micro cracks, which at first are not visible. Early detection of shaft torsional deflection allows for preventive mitigation actions—i.e. scheduling shutdown and repairs. Moreover it also helps with evaluation of the expected operational time until failure. Additionally usually it is difficult to determine the root cause of shaft deflection. It is not known—what was first: the shaft deflection (mechanical problem) or the DC link degradation (electrical problem).

There is known from U.S. Pat. No. 5,253,531A a method for shaft torsional displacement detection. A rotating shaft torsional displacement and speed detector provides a light beam which impinges on one or both ends of the rotating shaft. Different combinations of beam altering materials such as reflecting and non-reflecting surfaces, wave retarding plates, and linear polarizers are attached to the front shaft end and rear shaft end. These beam altering materials change either the polarization or magnitude of the light beam in a predictable manner that allows for the detection of shaft speed and torsional displacement of the front shaft end with respect to the rear shaft end.

The disadvantage of the method is the need for usage of additional material having reflecting and non-reflecting surfaces. Moreover usage of a light beam device makes the solution big in size. The solution does not give any information on the possible root cause of the problem—there is no information on what was first—the shaft deflection-mechanical problem or the DC link degradation—electrical problem.

SUMMARY OF THE INVENTION

The method according to the invention uses a current and voltage signals measurement of the driving electrical machine and an angular speed measurement of the shaft of the drivetrain and comprises the step of measuring of a voltage $U_{DC}$ of the DC link unit of a converter where said unit is electrically connected with a computer diagnostic unit; the step of calculating a value of a load torque $T_{load}$ of the driving electrical machine; the step of detecting of an oscillation $Osc(T_{load})$ in the load torque $T_{load}$ and calculation magnitudes of characteristic frequencies of Fast Fourier Transform $FFT(U_{DC})$ of the voltage $U_{DC}$ of DC link unit if oscillation $Osc(T_{load})$; the step of determining of a timestamp indicator $t_{Tload}$ for oscillations $Osc(T_{load})$ and a timestamp indicator $t_{FFT}$ of $U_{DC}$ for magnitudes of characteristic frequencies of $FFT(U_{DC})$ of the voltage $U_{DC}$ of DC link unit; the step of comparing the value of the timestamp indicators $t_{Tload}$ and $t_{FFT}$ and determining a torsional deflection of the rotation shaft if $t_{Tload} < t_{FFT}$ or a DC link deterioration if $t_{Tload} > t_{FFT}$; the step of presenting the result of the comparison to the user in a diagnostic unit.

Preferably an alarm is triggered in one of modules of a diagnostic unit when the torsional deflection of the rotation shaft is determined.

Preferably the voltage $U_{DC}$ of the DC link unit is measured in a link circuit and a DC link voltage measuring device which are electrically connected parallel.

Preferably the DC link circuit comprises capacitor C and an Equivalent of Series Resistance ESR.

The essence of a device according to the invention is that the converter unit comprises a DC link unit for measuring of a voltage $U_{DC}$, which DC link unit is electrically connected with a computer diagnostic unit; the computer diagnostic unit has means: for calculating a value of a load torque $T_{load}$; means for detecting of an oscillation $Osc(T_{load})$ in the load torque $T_{load}$ and for calculation magnitudes of characteristic frequencies of Fast Fourier Transform $FFT(U_{DC})$ of the voltage $U_{DC}$ of DC link unit; means for determining the timestamp indicator $t_{Tload}$ for oscillations $Osc(T_{load})$ and a timestamp indicator $t_{FFT}$ of $U_{DC}$ for magnitudes of characteristic frequencies of $FFT(U_{DC})$ of the voltage $U_{DC}$ of DC link unit; means for comparing the value of the timestamp indicators $t_{Tload}$ and $t_{FFT}$ and means for determining a torsional deflection of the rotation shaft if $t_{Tload} < t_{FFT}$ or a DC link deterioration if $t_{Tload} > t_{FFT}$; means for presenting the result of the comparison to the user in a diagnostic unit.

Preferably the diagnostic unit has means for triggering an alarm when the torsional deflection of the rotation shaft of the drivetrain is determined.

Preferably the DC link unit is formed by a link circuit and a DC link voltage measuring device which are electrically connected parallel.

Preferably the DC link circuit has a form of a capacitor C and an Equivalent of Series Resistance ESR.

Preferably the DC link unit is connected with a rectifying unit for converting the AC input voltage into DC output voltage and with a an inverter unit for converting the DC input voltage into AC output voltage.

Preferably the rectifying unit has at least one pair of solid state switches, forming an rectifying switching leg for each phase a, b, c.

Preferably the inverter unit has at least one pair of solid state switches, forming an rectify switching leg for each phase a, b, c.

The advantages of the solution according to the invention are the following:
 The method uses only one angular speed sensor for measurement what simplifies the design of the device.
 The method uses only one line-to-line voltage and current measurements what simplifies the method.

The method provides a methodology how to distinguish the root cause of the problem, if it is an electrical or a mechanical failure reasons.

The inventive solution is based on torsional deflection determination based on speed measurement and power calculation from measurement electrical signals and unites DC-link voltage measurement and frequency analysis of this measurement. It allows for root cause determination of the undesired event—what was first—mechanical or electrical problem.

The present invention in an exemplary embodiment is explained in the drawing where:

Figure 3:
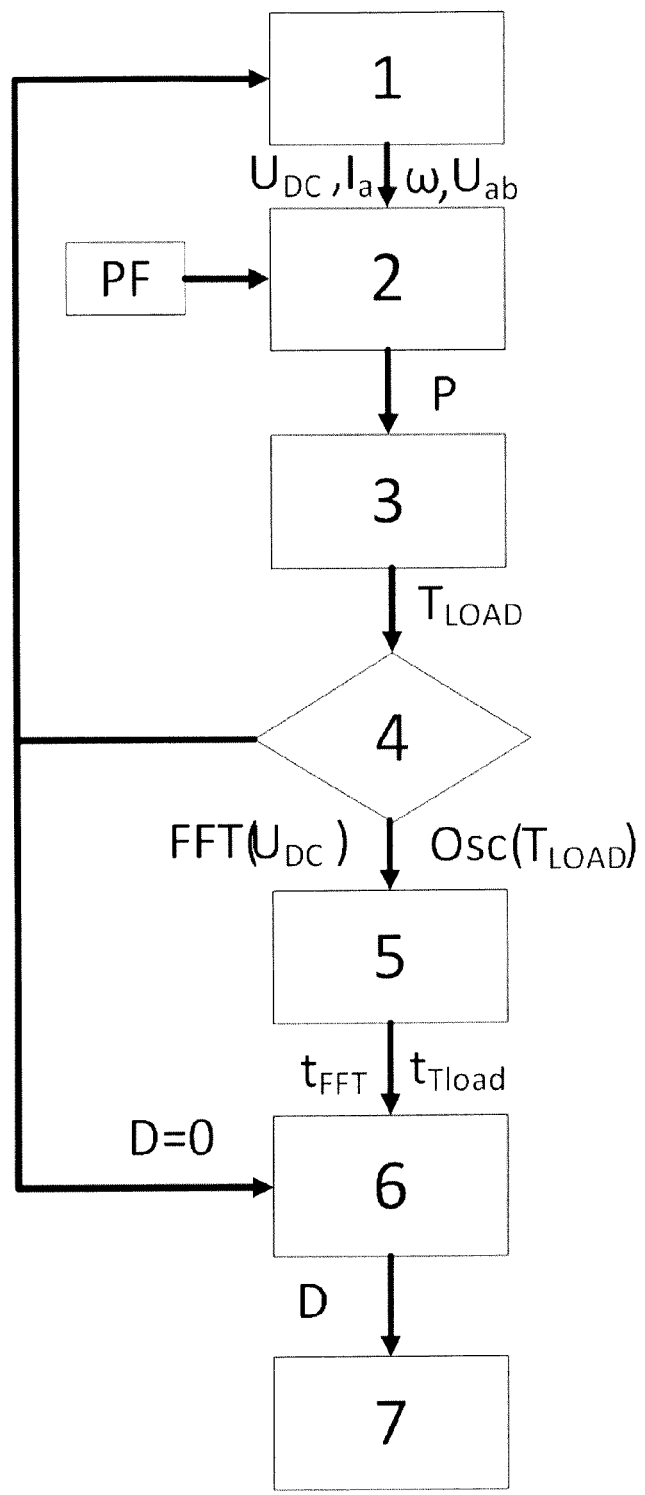
Figure 4:
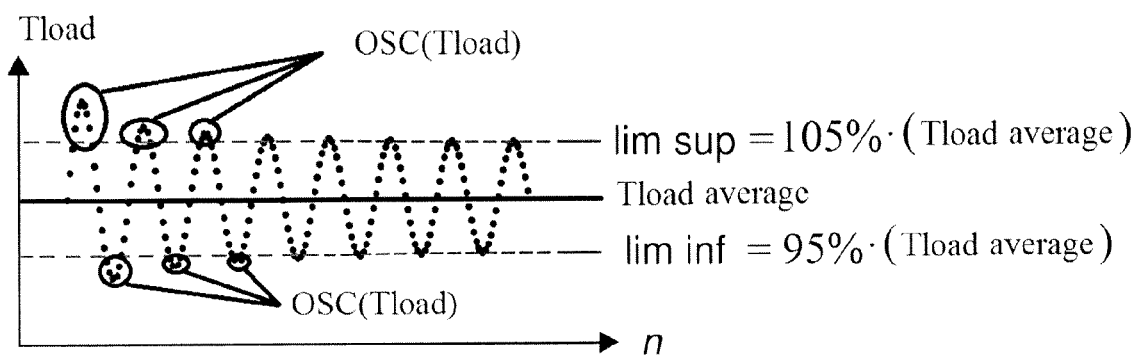
Figure 5:
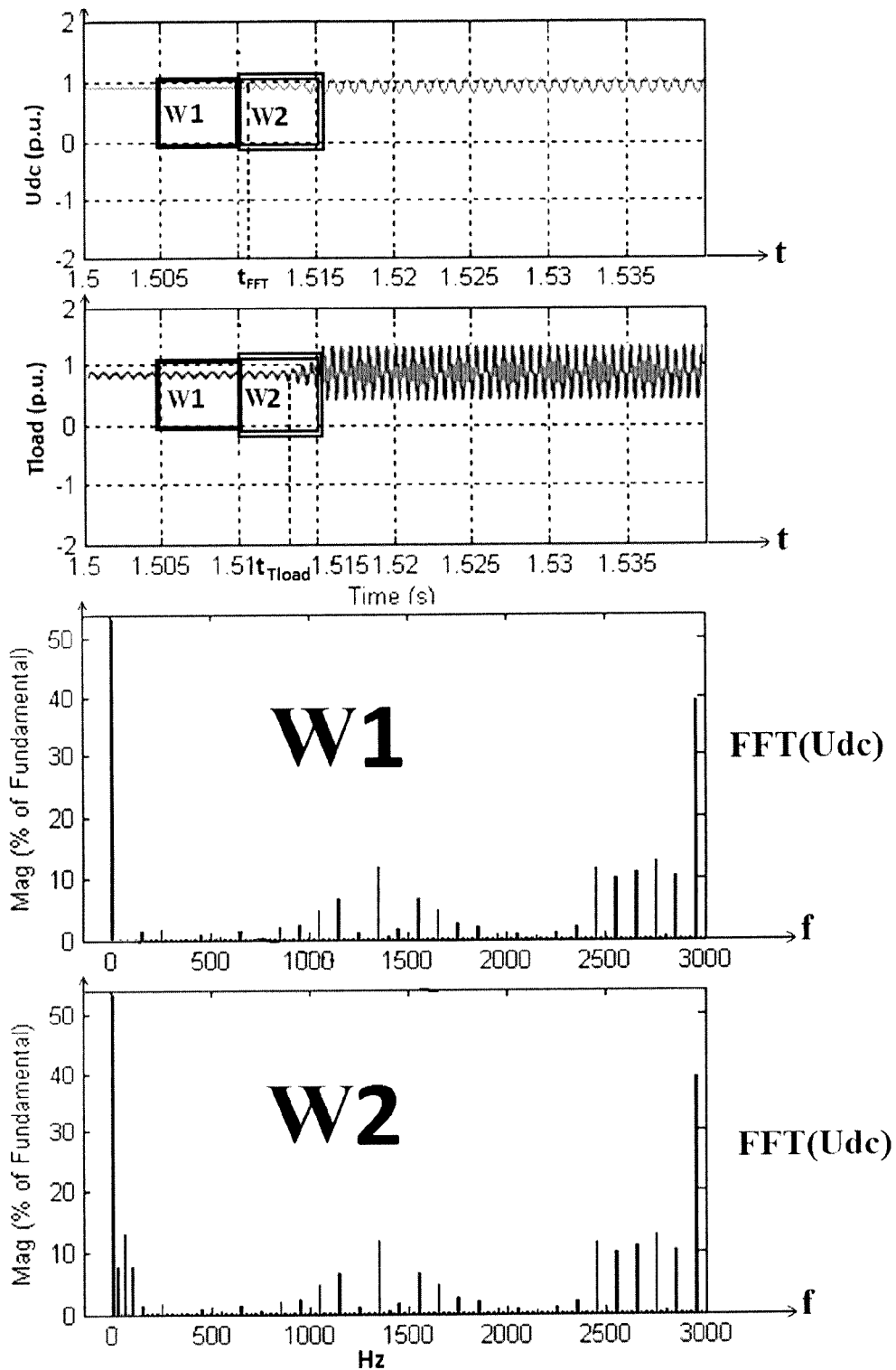

FIG. 3 is a flowchart of operations performed for the method of determination of a torsional deflection of a rotation shaft, FIG. 4 presents a diagram of detection an oscillation OSC(Tload) in in a load torque $T_{load}$, FIG. 5 presents diagrams of magnitudes of characteristic frequencies of FFT($U_{DC}$) of the voltage $U_{DC}$ and special timestamp indicator $t_{Tload}$ for oscillations Osc($T_{load}$) and special timestamp indicator $t_{FFT}$ for magnitudes of characteristic frequencies of FFT($U_{DC}$).

Figure 1:
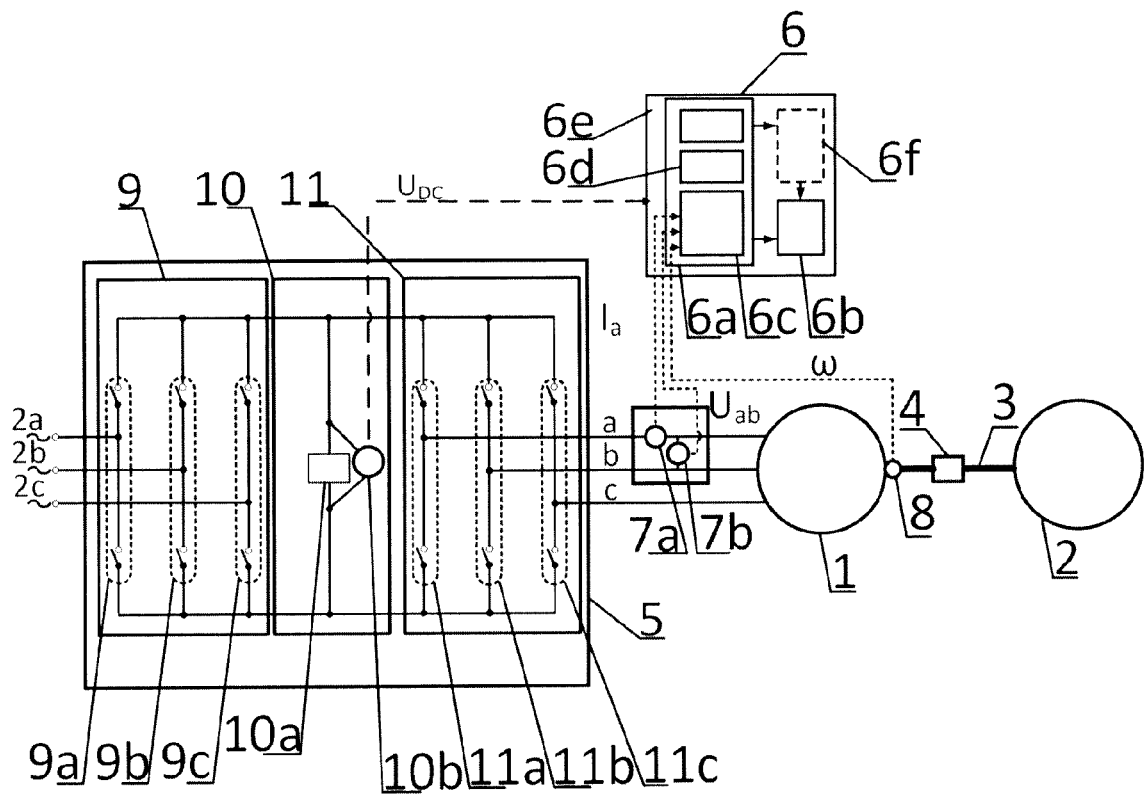
FIG. 1 is a block diagram of the mechanical drive system.
Figure 2:
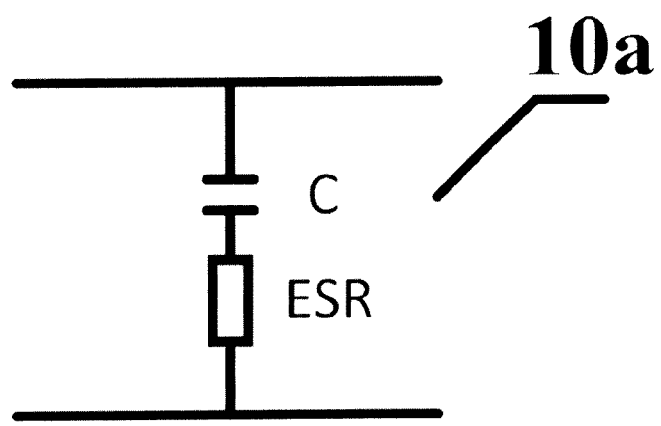
FIG. 2 is an electrical scheme of basic DC link circuit.

A mechanical drivetrain system, powered by three phase power supply lines a, b, c, comprises an driving electrical machine 1, for example a motor, a load electrical machine 2, connecting by a shaft 3 with a mechanical coupling 4, which is one of the possible known kinds—e.g. direct coupling, gearbox, clutch etc. Next the drivetrain system comprises a power converter unit 5 connected electrically with the driving electrical machine 1 and with a computer diagnostic unit 6. The diagnostic unit 6 is electrically connected with at least one phase a, b, c of the driving electrical machine 1 through a current sensor 7a and a voltage sensor 7b through at least two phases a and b of the driving electrical machine 1. The diagnostic unit 6 is electrically connected with an angular speed sensor 8 placed on the shaft 3, near the driving electrical machine 1, measuring the angular speed of the shaft 3. The power converter unit 5 has a rectifying unit 9, a DC link unit 10 and an inverter unit 11, electrically connected with themselves. The power converter unit 5 and the diagnostic unit 6 are powered by three phase power supply lines a, b, c. The rectifying unit 9 has at least one pair of solid state switches 9a or 9b or 9c, forming an rectifying switching leg for each phase a, b, c, for converting the AC input voltage into DC output voltage. The solid state switches 9a, 9b, 9c of the rectifying unit 9 are one of the possible known kinds—e.g. diodes, transistors, thyristors, etc. The DC link unit 10 comprises at least one DC link circuit 10a and a DC link voltage measuring device 10b, connected to the link circuit 10a, for measuring a voltage $U_{DC}$ of the DC link unit 10. DC link circuit 10a comprises capacitor C and an Equivalent of Series Resistance ESR presented in FIG. 2. The inverter unit 11 has at least one pair of solid state switches 11a or 11b or 11c, forming an rectify switching leg for each phase a, b, c, for converting the DC input voltage into AC output voltage. The solid state switches 11a, 11b, 11c of the converter unit 11 can be one of the possible known kinds—e.g. transistors, thyristors etc. The converter diagnostic unit 6 is a computer device, having a processor 6a and a memory 6b, where the processor 6a is equipped with: a data acquisition module 6c, for receiving and processing input signals such as: a current of at least one phase a, b, c; for example $I_a$, measured by the sensor 7a; voltages $U_{ab}$, measured by the sensors 7b mounted on one of the power supply lines a, b or c; the voltage $U_{DC}$ of the DC link unit 10 and the angular speed ω of the shaft 3, measured by the sensor 8. The processor 6a of the converter diagnostic unit 6 is also equipped with a storing and calculation module 6d for storing data, for example a power factor value PF, and for calculating new data such as Fast Fourier Transform FFT of the measured voltage $U_{DC}$; for calculating an output power P from the measured current $I_a$, and the voltage $U_{ab}$, by multiplying the measured signal's values by the power value factor PF, delivered by the user; calculating a machine load torque $T_{load}$ from power output P which value is divided by the value of the angle velocity ω, measured by the sensor 8. The processor is further equipped with a detecting module 6e for detection an load torque oscillations OSC in the measured signal $U_{DC}$. Further the diagnostic unit 6 is equipped with an alarm unit 6f, for generating alarm if certain conditions determined in the detection module 6e are met. The conditions for alarm are presented in the next part of the description.

The inventive method is implemented according to the following steps S1-S7 presented in FIG. 3.

Step S1

In the step S1 some signals of the drivetrain are measured. A voltage $U_{DC}$ of the DC link is measured by the link circuit 10a and a DC link voltage measuring device 10b of the DC link. The current of one phase $I_a$, of three phase power supply lines is measured by the sensor 7a. The voltage of the line-to-line voltages $U_{ab}$ of three phase power supply lines by the sensors is measured by the sensor 7b. An angular speed to of the shaft 3 is measured by the an angular speed sensor 8. All measured parameters are delivered to the diagnostic unit 6 to the data acquisition module 6c for further processing in the modules 6d and 6e of the processor 6a.

Step S2

To the memory 6b of the diagnostic unit 6 a data concerning the value of a power factor PF is delivered by the user. The PF can have a value for example equal 0.9.

In the step S2 a converter output power P is calculated in the calculation module 6d of the diagnostic unit 6, according to the formula:

$$P = 3 \cdot U_{ab} \cdot I_a \cdot PF \quad (1)$$

where:

P—is a calculated converter output power, $U_{ab}$—is one of the measured line-to-line voltage at the output of converter unit, $I_a$—is measured an output converter current for one of the phases, PF—power factor delivered by the user.

Step S3

In the step S3 a value of a load torque $T_{load}$ of the machine load 2 is calculated in the calculation module 6d of the diagnostic unit 6 according to the formulae:

$$T_{load} = \frac{P}{\omega} \quad (2)$$

where:

$T_{load}$—is a load torque,

P—is a output power calculated in the step 2,

ω—is an angular speed measured in the step S1.

Step S4

In the step S4 a detection of oscillation Osc($T_{load}$) in a load torque $T_{load}$ is performed. This is done in detection module 6e. If $T_{load}$ is a sequence of numbers n; then presence of oscillation Osc($T_{load}$) of that sequence is defined as the difference between the limit superior and limit inferior of value $T_{load}$ for the n numbers, according to the formulae:

$$Osc(T_{load}) = \lim_{n\to\infty} sup T_{load} - \lim_{n\to\infty} inf T_{load} \quad (3)$$

The oscillation is zero if and only if the sequence converges. It is undefined if $$\lim_{n\to\infty} sup \text{ and } \lim_{n\to\infty} inf$$

are both equal to +∞ or both equal to −∞, that is, if the sequence tends to +∞ or −∞. The oscillations are considered to be present if either $$\lim_{n\to\infty} sup \text{ or } \lim_{n\to\infty} inf$$

limits are crossed as shown in FIG. 4. The upper and lower limits are set to i.e.

$$\lim_{n\to\infty} sup = 105\%$$

of $T_{load}$ average and $$\lim_{n\to\infty} inf = 95\%$$

$T_{load}$ average.

Additionally in the step S4 magnitudes of characteristic frequencies of Fast Fourier Transform FFT($U_{DC}$) of the voltage $U_{DC}$ of DC link unit 10 are calculated in the known way in the calculation module 6d of the diagnostic unit 6.

If oscillations Osc($T_{load}$) and magnitudes of characteristic frequencies of FFT($U_{DC}$) of the voltage $U_{DC}$ of DC link unit 10 are not present the action goes back to the step S1 and sets the deflection indicator D=0 for step S6.

Step S5

If oscillations Osc($T_{load}$) and magnitudes of characteristic frequencies of FFT($U_{DC}$) of the voltage $U_{DC}$ of DC link unit 10 are present then in the step S5 special timestamp indicator $t_{Tload}$ for oscillations Osc($T_{load}$) and special timestamp indicator $t_{FFT}$ for magnitudes of characteristic frequencies of FFT($U_{DC}$) of the voltage $U_{DC}$ of DC link unit 10 are indicated. In the FIG. 5 the measuring window W1 and W2 are present, in the graphs f($U_{dc}$, t), f($T_{load}$, t). For each graph a special timestamp indicator is indicated for the time when the oscillations Osc($T_{load}$) are detected. For the function f($U_{dc}$, t) a timestamp indicator $t_{FFT}$ is determined and for the function f($T_{load}$, t) a timestamps indicator $t_{Tload}$ is determined. In the window W2 in FIG. 5 the both timestamps indicators $t_{FFT}$ and $t_{Tload}$ are presented. The results of such frequency analysis are stored in the memory 6c of the processor 6a for further processing. In the FIG. 5 the windows W1 and W2 are also presented as a function of magnitude and frequency of the measured voltage of $U_{DC}$ using the magnitudes of characteristic frequencies FFT($U_{DC}$) for determination of characteristic frequencies. In the window W1 any characteristics frequencies for the timestamp indicator $t_{FFT}$ are present. In the window W2 some characteristics frequencies for the timestamp indicator $t_{FFT}$ are present.

The occurrence of characteristic frequency means that the torsional deflection of the shaft appears in the system or there is another problem with DC link itself.

Step S6

In the step 6 the comparison of the timestamp indicator $t_{Tload}$ and the timestamp indicator $t_{FFT}$ of $U_{DC}$ for the same window W1 or W2 is performed in the detecting module 6e. Such comparison allows for determination of a setting a conventional deflection indicator D which has a value 0 or 1 or 2, established by a user.

If oscillations Osc($T_{load}$) and magnitudes of characteristics frequencies of FFT($U_{DC}$) of the voltage $U_{DC}$ of DC link unit 10 are not present the setting deflection indicator D=0, which was taken from step S4.

If oscillations Osc($T_{load}$) and magnitudes of characteristics frequencies of FFT($U_{DC}$) of the voltage $U_{DC}$ of DC link unit 10 are present and indicated special timestamp indicators known from step 5 have the values fulfilling below relation:

If $t_{Tload} > t_{FFT}$ then D=1, it means that the problem is coming from DC link deterioration.

This is due to the fact that the symptoms of deterioration appeared first in DC link and then were propagated to the mechanical part so $t_{Tload} > t_{FFT}$.

If oscillations Osc(Tload) and magnitudes of characteristics frequencies of FFT($U_{DC}$) of the voltage $U_{DC}$ of DC link unit 10 are present and indicated special timestamp indicators known from step 5 have the values fulfilling below relation:

If $t_{Tload} < t_{FFT}$ then D=2, it means that the problem is coming from mechanical failures and the torsional deflection is occurred.

This is due to the fact that the symptoms of deterioration appeared first in mechanical part and then were propagated to the DC link part so $t_{Tload} < t_{FFT}$.

The result of the comparison is indicated in the diagnostic unit 6, for example as displayed value of the deflection indicator D. Additionally the value of the deflection indicator D is stored in memory 6b.

Step 7

In the step 7 additionally an alarm is generated in alarm generating module 6f. So the value of the setting deflection indicator D is the value for triggering an alarm in the diagnostic unit 6 or other device connected to the diagnostic unit 6, what is not presented in the drawing.

The invention claimed is:

1. A method of determination of a torsional deflection of a rotation shaft in an electromechanical drivetrain where the drivetrain is powered by three phase power supply lines through a converter unit and the drivetrain comprises a driving electrical machine connected by a shaft with a load electrical machine using a current and voltage signals measurement of the driving electrical machine and an angular speed measurement of the shaft, wherein the method comprises the steps of:

measuring of a voltage $U_{DC}$ of a DC link unit of the converter unit which is electrically connected with a computer diagnostic unit, calculating a value of a load torque $T_{load}$ by using a converter output power P, which is calculated from the measured current and voltage signals of the driving electrical machine in a calculation module of the diagnostic unit, detecting of an oscillation $O_{SC}(T_{load})$ in the load torque $T_{load}$ and magnitudes of characteristic frequencies of Fast Fourier Transform $FFT(U_{DC})$ of the voltage $U_{DC}$ for magnitudes of characteristic frequencies of FFT $(U_{DC})$ of the voltage $U_{DC}$ of the DC link unit, comparing the value of timestamp indicators $t_{load}$ and $t_{FFT}$ and determining the torsional deflection of the rotation shaft if $t_{load} < t_{FFT}$ or a DC link deterioration if $t_{load} > t_{FFT}$, presenting a result of the comparison to a user in the diagnostic unit.

2. The method according to claim 1, wherein an alarm is triggered in one of modules of a diagnostic unit when the torsional deflection of the rotation shaft is determined.

3. The method according to claim 1, wherein the voltage $U_{DC}$ of the DC link unit is measured in a link circuit and a DC link voltage measuring device which are electrically connected in parallel.

4. The method according to claim 3, wherein the DC link circuit comprises a capacitor C and an Equivalent of Series Resistance ESR.

5. A device for determination of a torsional deflection of a rotation shaft in an electromechanical drivetrain where the drivetrain is powered by three phase power supply lines through a converter unit and the drivetrain comprises a driving electrical machine connected by a shaft with a load electrical machine;

means connected to a computer diagnostic unit for current and voltage signals measurement of the driving electrical machine and an angular speed of the shaft, wherein the converter unit has a DC link unit for measuring of a voltage $U_{DC}$, which DC link unit is electrically connected diagnostic unit;

the computer diagnostic unit operable to:

calculate a value of a load torque $T_{load}$;

detect an oscillation $O_{SC}(T_{load})$ in the load torque $T_{load}$ and for calculation magnitudes of characteristic frequencies of Fast Fourier Transform $FFT(U_{DC})$ of the voltage $U_{DC}$ of the DC link unit;

determine a timestamp indicator $t_{Tload}$ for oscillations $O_{SC}(T_{load})$ and a timestamp indicator $t_{FFT}$ of $U_{DC}$ for magnitudes of characteristic frequencies of $FFT(U_{DC})$ of the voltage $U_{DC}$ of the DC link unit;

compare the value of the timestamp indicators $t_{Tload}$ and $t_{FFT}$ and means for determining the torsional deflection of the rotation shaft if $t_{Tload} < t_{FFT}$ or a DC link deterioration if $t_{Tload} > t_{FFT}$;

present the result of the comparison to a user in the diagnostic unit.

6. The device according to claim 5, wherein the diagnostic unit has means for triggering an alarm when the torsional deflection of the rotation shaft is determined.

7. The device according to claim 5, wherein the DC link unit is formed by a link circuit and a DC link voltage measuring device electrically connected parallel.

8. The device according to claim 7, wherein the DC link circuit has a form of a capacitor C and an Equivalent of Series Resistance ESR.

9. The device according to claim 5, wherein the DC link unit is connected with a rectifying unit for converting an AC input voltage into DC output voltage and with an inverter unit for converting the DC input voltage into AC output voltage.

10. The device according to claim 9, wherein the rectifying unit has at least one pair of solid state switches forming a rectifying switching leg for each phase.

11. The device according to claim 9, wherein the inverter unit has at least one pair of solid state switches forming a rectifying switching leg for each phase.

12. The method according to claim 2, wherein the voltage $U_{DC}$ of the DC link unit is measured in a link circuit and a DC link voltage measuring device which are electrically connected parallel.

13. The method according to claim 12, wherein the DC link circuit comprises a capacitor C and an Equivalent of Series Resistance ESR.

14. The device according to claim 6, wherein the DC link unit is formed by a link circuit and a DC link voltage measuring device electrically connected in parallel.

15. The device according to claim 14, wherein the DC link circuit has a form of a capacitor C and an Equivalent of Series Resistance ESR.

16. The device according to claim 6, wherein the DC link unit is connected with a rectifying unit for converting an AC input voltage into DC output voltage and with an inverter unit for converting the DC input voltage into AC output voltage.

17. The device according to claim 7, wherein the DC link unit is connected with a rectifying unit for converting an AC input voltage into DC output voltage and with an inverter unit for converting the DC input voltage into AC output voltage.

18. The device according to claim 8, wherein the DC link unit is connected with a rectifying unit for converting an AC input voltage into DC output voltage and with an inverter unit for converting the DC input voltage into AC output voltage.

19. The device according to claim 9, wherein the rectifying unit has at least one pair of solid state switches forming a rectifying switching leg for each phase.

20. The device according to claim 16, wherein the inverter unit has at least one pair of solid state switches forming a rectifying switching leg for each phase.

* * * * *